United States Patent [19]
Jackson et al.

[11] Patent Number: 5,629,517
[45] Date of Patent: May 13, 1997

[54] SENSOR ELEMENT ARRAY HAVING OVERLAPPING DETECTION ZONES

[75] Inventors: Warren B. Jackson, San Francisco; David K. Biegelsen, Portola Valley; Robert A. Street, Palo Alto; Richard L. Weisfield, Los Altos, all of Calif.

[73] Assignee: Xerox Corporation, Stamford, Conn.

[21] Appl. No.: 423,906

[22] Filed: Apr. 17, 1995

[51] Int. Cl.$^6$ .......................... H01L 27/00; H01L 31/00
[52] U.S. Cl. ........................... 250/208.1; 257/448
[58] Field of Search ............ 250/208.1; 257/59, 257/72, 448

[56] References Cited

U.S. PATENT DOCUMENTS

| | | | |
|---|---|---|---|
| 4,972,252 | 11/1990 | Maekawa | 257/448 |
| 5,138,146 | 8/1992 | Idesawa | 257/59 |
| 5,502,319 | 3/1996 | Kim | 257/448 |

*Primary Examiner*—Stephone Allen
*Attorney, Agent, or Firm*—Robert A. Burtzlaff

[57] ABSTRACT

An image sensor array has overlapping responsive zones for detecting incident radiation. The sensor array includes a plurality of collection electrodes for sensing charge and a charge distribution layer in contact with the collection electrodes. The charge distribution layer is configured to distribute charge generated from incident radiation to more than one collection electrode, effectively providing overlapping responsive zones that reduce adverse aliasing effects.

7 Claims, 10 Drawing Sheets

SENSOR ELEMENT ARRAY HAVING OVERLAPPING DETECTION ZONES

FIELD OF THE INVENTION

This invention relates to a sensor element array for detection of incident radiation. More particularly, this invention relates to sensor elements having detection zones that overlap with neighboring sensor elements.

BACKGROUND AND SUMMARY OF THE INVENTION

Most conventional image sensors operate by sensing an image projected onto an array of discrete, physically separated image sensor elements. The electrical response of each image sensor element is proportional to the total light falling within its boundaries. The electrical pattern held by the array of discrete image sensor elements is retrieved by sequentially interrogating the electrical response of each of the sensor elements. Currently, the light sensitive areas of the individual detector elements are designed to be discrete, with light falling within one detector element only inducing an electrical response in that particular light illuminated detector element.

Isolation between neighboring detector elements is commonly achieved by physically patterning the active region of each detector element so that it is isolated from its neighbors. However, physical isolation of detector elements has a number of drawbacks. For example, the isolation of the detector elements requires additional patterning and photolithographic steps. At least one, and possibly more, mask steps must be devoted to ensuring that the detector elements remain isolated from each other.

Another problem associated with patterning techniques for detector element isolation is that the aperture or active area of a pixel is already limited by the space allocated to signal lines and pass transistors. Indeed, the active area fraction of a pixel is significantly less than one, being as low as 30-40 percent for high resolution image sensors. If the surface area devoted to physical isolation of detector elements can be reduced, economy and yield can be increased while maintaining the same signal to noise ratio.

The use of physical patterning for detector element isolation can lead to undesirable artifacts in scanned images. For example, aliasing patterns, also known as moire effects, result from interference between periodic structures in the image and the inherent periodicity of the patterned detector elements. This interference causes spurious periodic features to appear in a scanned image that are not present in the original image. Unfortunately, the aliasing patterns can not be removed by image processing techniques because it is not known a priori whether a given spatial pattern is an unwanted result of aliasing, or an actual pattern that exists in the image.

Aliasing problems in an image can be reduced by several techniques, with a decrease in detector element size and spacing being the most straightforward. If the detector element spacing frequency is greater than twice the spatial frequency of periodic image features, aliasing can generally be avoided. However, physical limitations in current detector fabrication methods, coupled with the increased cost of an array of very small detector elements, and the high frequency of periodic spatial image detail desired for high resolution sensor systems, place limits on widespread implementation of this solution. Another potential solution to aliasing problems relies on decreasing the gap distance between detector elements. However, there is again increased difficulty and cost associated with fabrication of a gapless detector element array. In addition, even if the gap distance is reduced to zero, high spatial frequency periodic image features (those with a frequency greater than twice the frequency of detector element spacing) will still cause aliasing problems. More effective anti-aliasing techniques are required for fabrication of inexpensive and reliable high resolution systems with minimal image aliasing, The present invention minimizes aliasing problems by providing for fabrication of an array of detector elements with overlapping responsive areas. Because the responsive areas can be made larger than the spacing between the detector elements, aliasing and moire effects can be greatly attenuated. In addition, the responsivity of the overlapping detection areas utilized in the present invention changes smoothly to zero, eliminating high frequency sidelobes (with its resultant aliasing) associated with conventional non-continuous sharp edged detector elements. This is accomplished by forming an image sensor array having a plurality of detection zones for producing photogenerated charge, with each detection zone centered on a charge collection element for holding charge, and with local detection response in each detection zone smoothly decreasing with distance from each charge collection element.

In preferred embodiments, the present invention is an image sensor array having overlapping responsive zones. These overlapping responsive zones are respectively centered on a plurality of collection electrodes, and utilize a photosensitive or radiation sensitive layer (e.g., a layer that responds to photonic radiation, including visible light, ultraviolet, x-rays, or non-photonic sources such as charged particles) in contact with the collection electrodes to generate photoinduced charge. Preferably, the photosensitive layer (which hereinafter is defined to include all energetic forms of radiation) is configured to distribute locally photogenerated charge to more than one collection electrode.

To improve ease of measuring the photoinduced charge, a plurality of pass transistors can be connected to receive charge from the collection electrodes. In certain embodiments field effect pass transistors are used, with each pass transistor having a drain connected to one of the collection electrodes, a source separated from the drain, and a pass transistor gate electrode controllable to promote passage of photoinduced charge from the drain to the source. Alternatively, a pass transistor can be arranged so that the photoinduced charge controls external current passing between a drain and a source, an arrangement which advantageously allows for signal amplification at the pass transistor. The present invention can also be used for color applications with the addition of more photosensitive layers.

In a most preferred embodiment, an image detector array in accordance with the present invention includes a plurality of collection electrodes organized in a one or two dimensional array. A continuous photosensitive layer in contact with each of the collection electrodes is configured to produce a detectable response at the collection electrode upon incidence of radiation (usually, but not limited to light) in a responsive zone. To minimize aliasing, the image detector array is arranged to present overlapping radiation responsive zones associated with each of the collection electrodes. A real extent of the overlap is controlled by adjustments to collection electrode resistivity. Typically, the collection electrode is constructed from an n+ doped amorphous silicon layer, and is adjacent to the photosensitive layer, an intrinsic amorphous silicon layer, which in turn is adjacent to a p+ doped layer, forming a p-i-n diode.

Other objects and advantages of the present invention will become apparent to those skilled in the art upon consider-

DETAILED DESCRIPTION OF THE INVENTION

Figure 1:
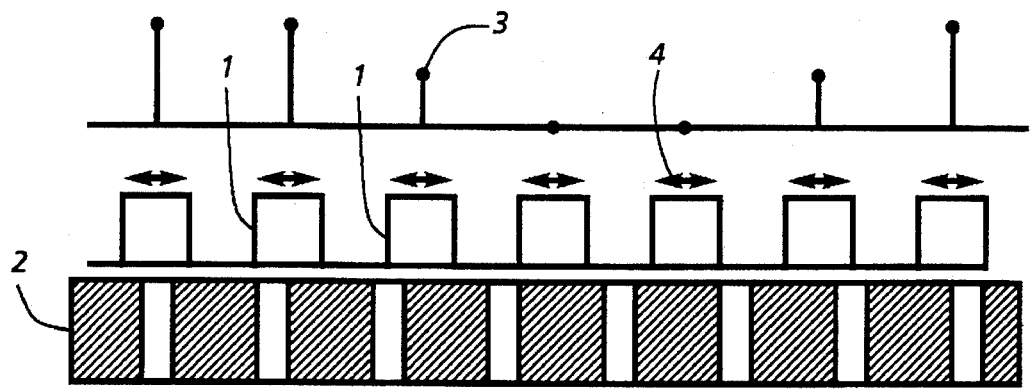
FIG. 1 illustrates aliasing effects on detector output, showing a periodic array of conventional spaced apart detector elements with discrete detection zones for incident radiation.
Figure 2:
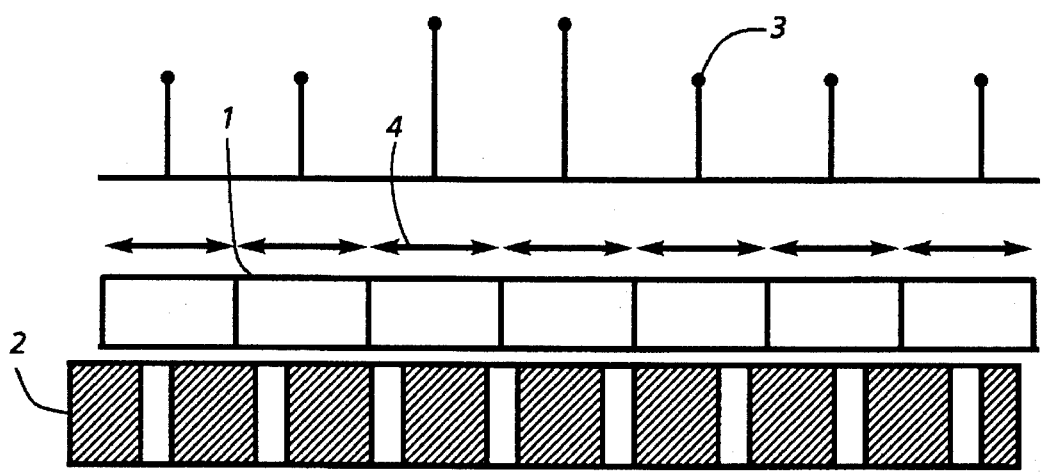
FIG. 2 is an illustration similar to FIG. 1, with conventional contiguously arranged detector elements having discrete detection zones for incident radiation.
Figure 3:
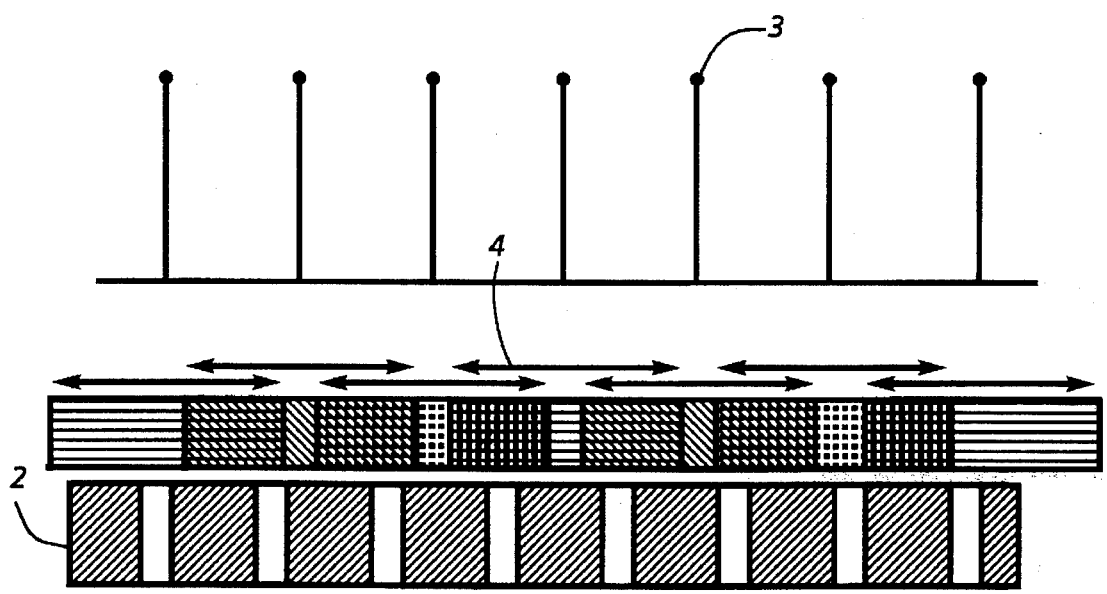
FIG. 3 is an illustration similar to FIGS. 1 and 2, with novel detector elements in accordance with the present invention having overlapping detection zones for incident radiation.

Generation of aliasing artifacts through unwanted interaction between periodic image features and periodic structural features of image detectors can be understood with reference to FIGS. 1, 2, and 3. As illustrated in each of those Figures, a one dimensional image consisting of periodic, equal intensity light stripes 2 is projected onto detector elements 1. Each detector element 1 has a detection zone 4 in which incident radiation produces a detector output 3. As can can be seen by inspection of FIG. 1, detector output 3 from the detector elements 1 exhibits periodic oscillations (aliasing artifacts) not representative of the actual pattern of light stripes 2 on the detector elements.

One possible method of reducing the amplitude of the aliasing artifacts in the detector output is illustrated in FIG. 2. If the detector elements 1 are contiguously arranged so that there are no intervening gaps between detectors, with each detector 1 having a detection zone 4 that just touches its neighbor, the amplitude of aliasing artifacts in detector output 3 in response to light stripes 2 is reduced by a factor of two as compared to that illustrated in FIG. 1. However, even this degree of amplitude reduction still leaves noticeable aliasing artifacts in detector output.

A solution to the problem of aliasing artifacts in accordance with the present invention is illustrated in FIG. 3. In that Figure, detector elements 1 have overlapping detection zones 4. As can be seen by inspection of FIG. 3, the amplitude of aliasing artifacts in detector output 3 from detector elements 1 in response to light stripes 2 is substantially reduced as compared to that illustrated in FIGS. 1 and 2. In fact, the degree of amplitude reduction is enough to make unnoticeable any aliasing artifacts in the detector output.

The effectiveness of overlapping detection zones for eliminating or substantially reducing aliasing artifacts can also be understood when viewed in the spatial frequency domain. Artifactual patterns occur at frequencies equal to the difference frequencies between the detector periodicity and the dominant image frequencies. The amplitude of the sum and difference components are modulated by the Fourier transform of an individual detector. A small individual detector in an array necessarily has a large spatial frequency pass band. In contrast, overlapping detectors in an array exhibit a narrow pass band, because the lack of size constraint (as compared to isolated or contiguously arranged small detectors) means that they can be designed to have a large detection zone. If the detector is twice as large as the spacing between the elements, the frequency of the artifactual periodicities in the image are attenuated sufficiently to make unobservable most aliasing patterns.

Figure 4:
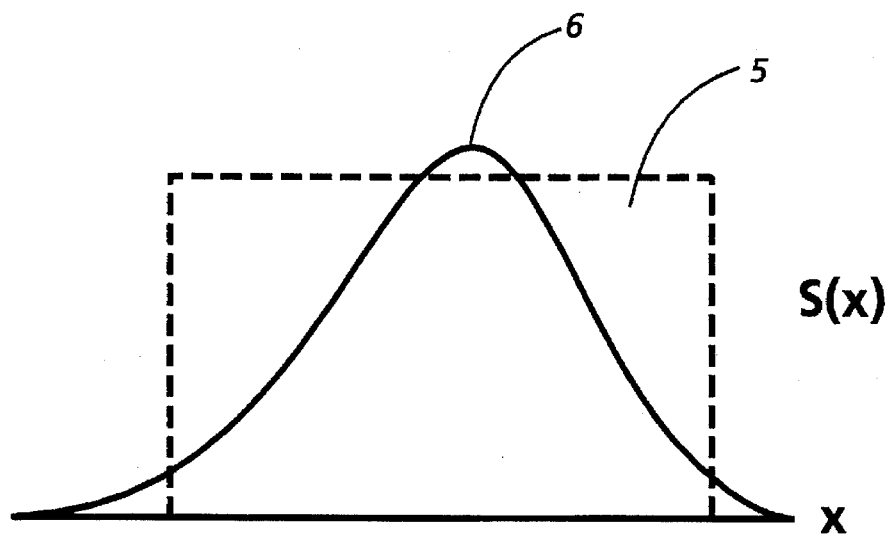
FIG. 4 compares response to incident radiation of a detector with an abrupt detection zone (dotted line) to response to incident radiation of a detector with a smoothly varying detection zone (solid line)
Figure 5:
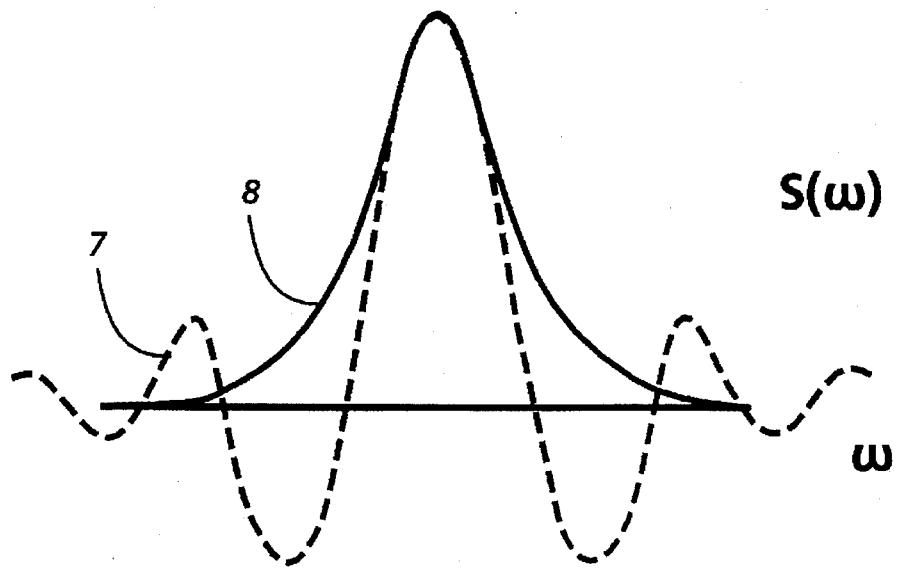
FIG. 5 illustrates ringing in output response versus spatial frequency for the detector of FIG. 4.

A further problem with conventional patterned detectors is apparent when viewing detector response in the spatial frequency domain. Because the response of a physically patterned detector is spatially abrupt, the corresponding spatial frequencies of the individual detector are high. This phenomenon is illustrated with reference to FIGS. 4 and 5. FIG. 4 respectively shows response of an abrupt detector (dashed line 5 in FIG. 4) and a detector whose response decreases gradually (solid line 6 in FIG. 4). The spatial frequency response of these detectors is illustrated in FIG. 5. As can be seen, the secondary sidelobes (dashed line 7 in FIG. 5) present in the frequency response of the abrupt detector are greatly reduced as compared to the frequency response (solid line 8 in FIG. 5) of a detector with a gradual response curve. Because beating of high frequency components passed by the sidelobes gives rise to aliasing artifacts, it will be appreciated by those skilled in the art that it is advantageous to fabricate detectors elements having a response that approaches zero smoothly.

Figure 6:
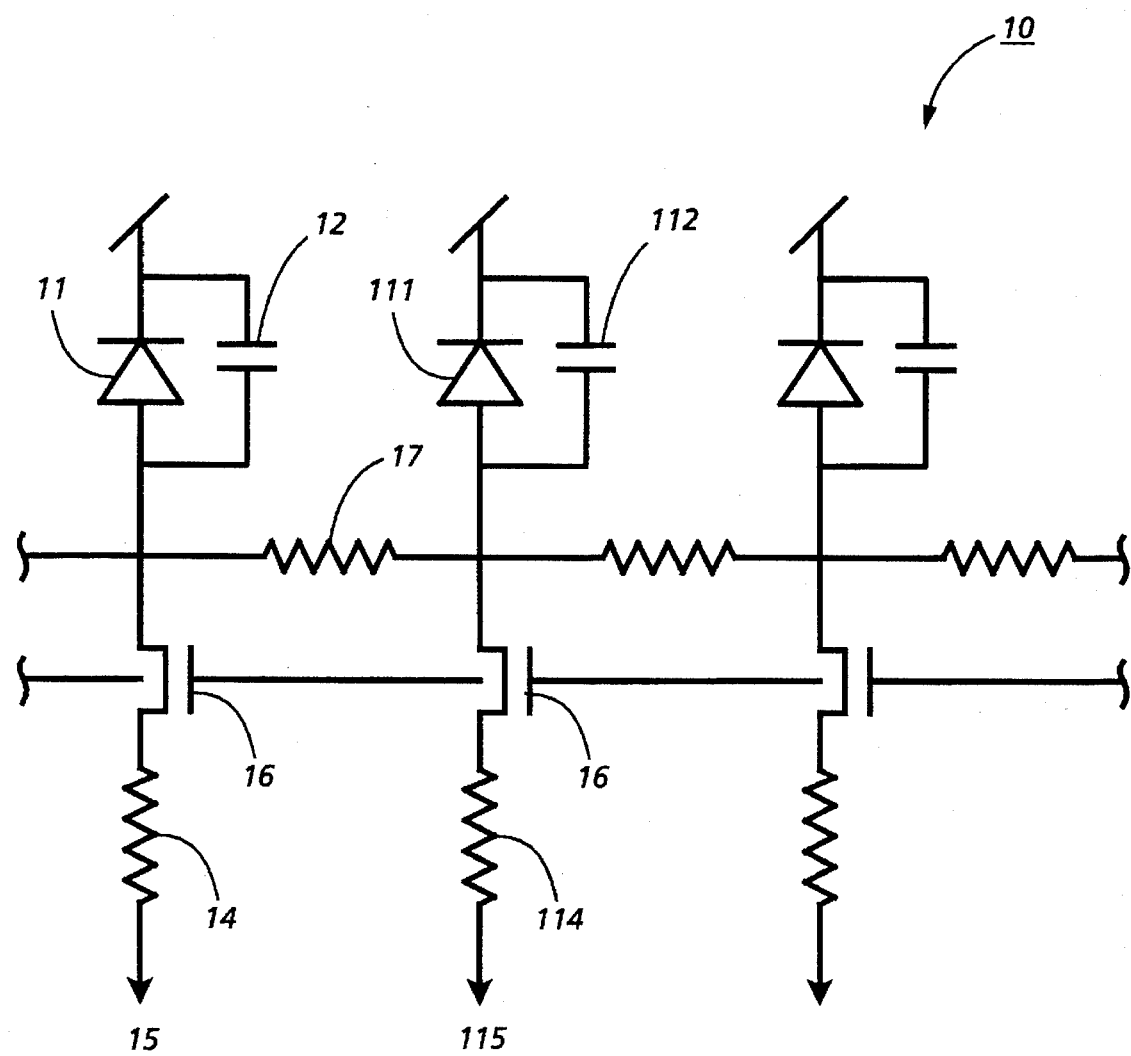
FIG. 6 is an electrical schematic for a line of collection electrodes in accordance with the present invention that allow distribution of charge to neighboring collection electrodes.

The present invention overcomes problems with conventional patterned photodetectors having abrupt, isolated detector response by providing detector elements in a photodetector imaging array having overlapping receptive fields. In practice, overlapping detector response is effected by charge sharing between neighboring detector elements. This is schematically illustrated in FIG. 6, which shows a portion of a linear photodiode sensor array 10. When a photodiode 11 is illuminated, a photoinduced charge proportional to the amount of incident radiation is created. While some of the charge is immediately stored in capacitance 12, a certain percentage of the charge is distributed to capacitance 112 of a neighboring photodiode 111, drifting through a resistive element 17. The use of resistive element 17 to connect neighboring detectors ensures that the charge stored at capacitance 112 is not just from photodiode 111, but also from photodiode 11, and to a somewhat lesser degree from even more remote detector elements. As will be appreciated, the degree of overlap response for detector elements can be changed by modifying the resistance of resistive element 17. As desired, one can create overlap in detector response between only the immediate neighbors, or from neighbors positioned two, three, or more sites away in a detector array. Readout of the stored charge at capacitance 12 and 112 involves setting the gate line 16 high, and passing the respective integrated charge of capacitances 12 and 112 to amplifiers 15 and 115 through impedances 14 and 114.

As also will be appreciated by those skilled in the art, operation of the present invention in accordance with the foregoing discussed electrical schematic of photodiode sensor array 10 can involve single or multiple layer semiconductor or conductive structures. For example, it is possible to produce photogenerated charge in a first photogenerative layer, and use a second conductive charge distribution layer to laterally distribute that charge amongst multiple detector elements for overlapping response. For best results, the charge distribution layer should have a lateral sheet resistance more than an order of magnitude less than the lateral sheet resistance of the photogenerative layer. Alternatively, a single semiconductive layer that generates photocharge and laterally distributes that charge can be employed.

Figure 7:
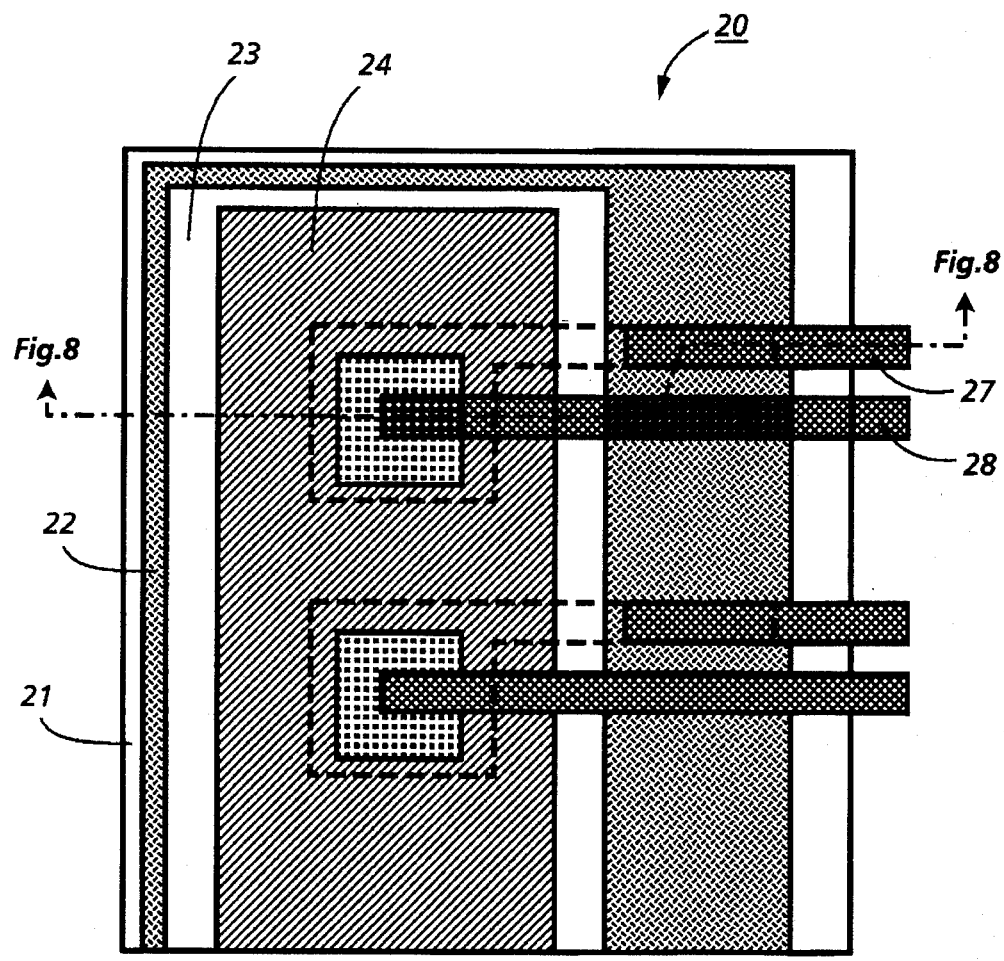
FIG. 7 presents a plan view of a portion of a one dimensional sensor array with multiple sensor elements in accordance with the present invention.
Figure 8:
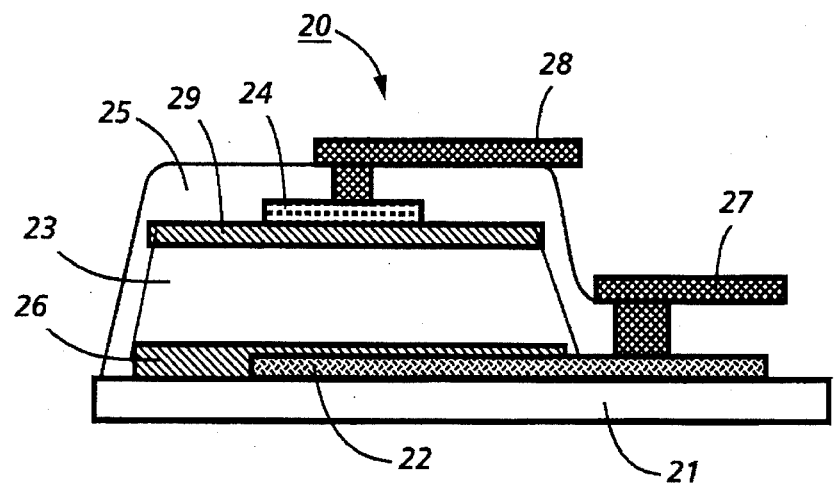
FIG. 8 is a cross sectional view taken substantially along line 8—8 of FIG. 7.

A one dimensional overlapping sensor array 20 having multiple layers that respectively generate photocharge (in an intrinsic semiconductor layer) and distribute that charge (in an n-type layer) in accordance with the present invention is illustrated in FIGS. 7 and 8. Construction of sensor array 20 begins with provision of a glass, silicon, or other suitable substrate 21 onto which a bottom contact 22 is fabricated (Mo/Cr or other conventional conductors can be used). An active layer 26 is deposited on top of bottom contact 22, and is fabricated from n-type materials (e.g., phosphorus doped polycrystalline silicon or amorphous silicon). Over most of this active layer 26, an intrinsic layer 23 of amorphous silicon is deposited, followed by deposition of a p-type layer 29 (e.g., boron doped amorphous silicon). Since the layer 29 is a p-type layer, the combination of layer 29, intrinsic layer 23, and active layer 26 together form a p-i-n detector with a radiation sensitive region that allows for creation of holes and electrons in the intrinsic layer 23 in response to impinging radiation, including ultraviolet, visible, infrared light, or other energetic radiation. The boron-doped p-type layer 29 is optionally topped with a transparent contact 24 through which radiation can pass, and covered with a passivation layer 25 fabricated from a suitable dielectric layer such as silicon oxynitride for protection.

To provide electrical contact with the transparent contact 24, a via is cut through the passivation layer 25. A top electrode 28 (generally fashioned from aluminum or other conductive material) is deposited in the via to ensure electrical contact with the transparent contact 24, and the underlying layers 29, 23, and 26. In addition, a via is cut through passivation layer 25 to bottom contact 22, and a collection electrode 27 (often fabricated from n+ amorphous silicon, aluminum, or other suitable conductive material) is deposited in the via to form an ohmic contact with the bottom contact 22.

Figure 9:
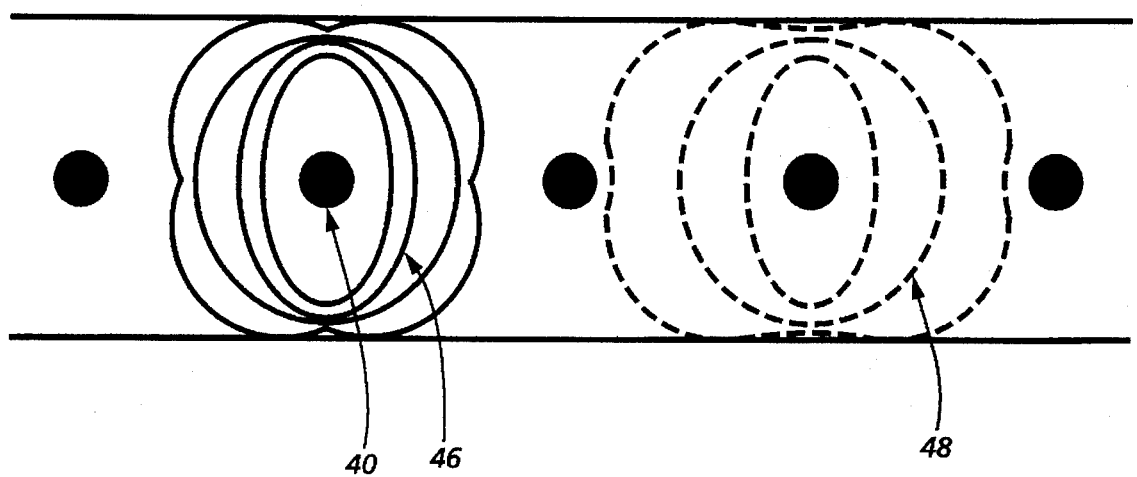
FIG. 9 schematically represents isocurrent charge collection contours of photosensitivity around individual collection electrodes.

In operation, the consecutively arranged layers 29, 23, and 26 are reversed biased to form a p-i-n detector. Illumination of the sensor array 20 with incident radiation causes the formation of electrons and holes in the intrinsic layer 23. These electrons and holes separate in the electric field between the p-type layer 29 and the active layer 26 of the array 20, with the holes moving toward the p-type layer 29 while the electrons drift toward the active layer 26. The electron current flows both through the active layer 26 to bottom contact 22 and collection electrode 27, and through the active layer 26 to neighboring collection electrodes for overlapping detector response. The degree of detector overlap between neighboring sensor elements in the array 20 is controlled by varying termination impedance at the collection electrode 27. When the termination impedance at the collection electrode 27 is small compared with sheet resistance of the active layer 26, the amount of detector response overlap is relatively small, as indicated by solid isocurrent response lines 46 in FIG. 9. Conversely, if the termination impedance of the electrodes is increased to values comparable to or greater than the sheet resistance of the n+ layer, the effective collection region of each collection electrode 27 increases in size as indicated by dashed isocurrent response lines 48 in FIG. 9. By appropriate choice of termination impedances, the response region of each electrode can be made to be twice the spacing between collection electrodes 27 or even larger, forming an image detector array with overlapping receptive fields.

As those skilled in the art will appreciate, it is of course possible to reverse the order of the p-type layers and the n-type layers, forming an n-i-p sensor instead of the described p-i-n sensor. With the appropriate changes to bias, operation of such a reversed device would be similar to the previously described embodiment, except that the p-type layer, rather than the n-type layer, would act to distribute charge produced in the photogenerative intrinsic layer.

Figure 10:
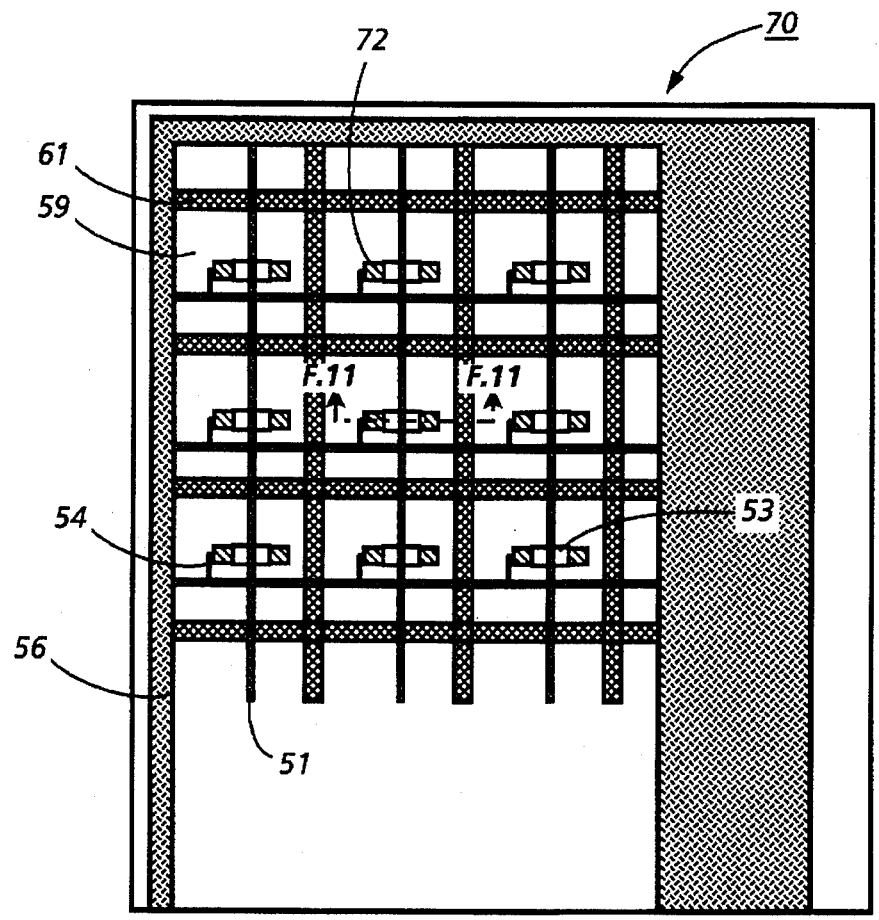
FIG. 10 is another embodiment of a two dimensional detector element array in accordance with the present invention, with the illustrated embodiment having a pass transistor.
Figure 11:
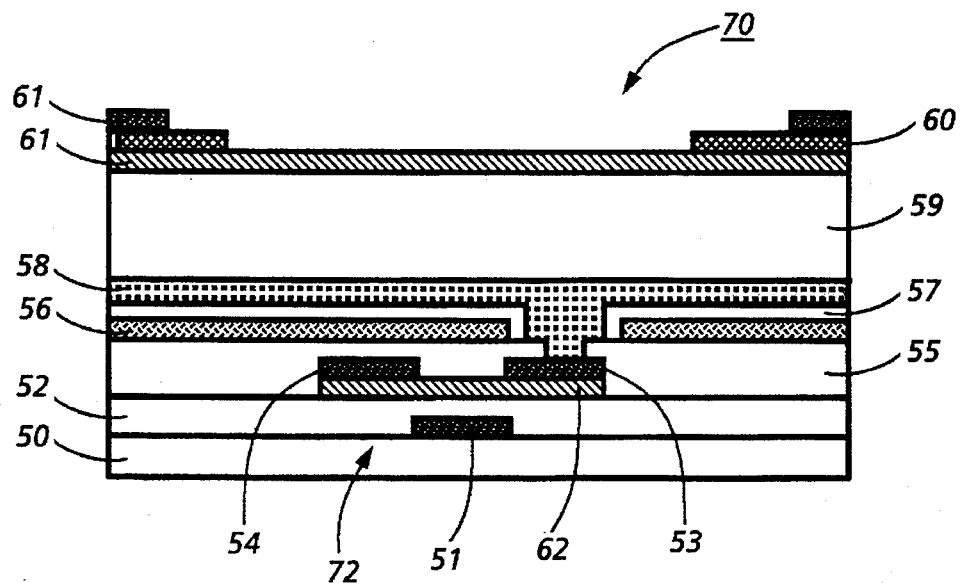
FIG. 11 is a cross sectional view taken substantially along line 11—11 of FIG. 10.

FIGS. 10 and 11 illustrate a two dimensional sensor array 70 having overlapping sensing elements in accordance with the present invention. As best seen in cross section in FIG. 11, array 70 includes a field effect pass transistor 72 deposited on a substrate 50. The pass transistor 72 is composed of a gate 51, a drain 53, a source 54, and a channel layer 62 that electrically connects the drain 53 and source 54 when the gate 51 generates an electric field. The drain 53 and source 54 are fashioned from conductive materials such as n+ amorphous silicon (e.g., phosphorus doped) or chromium, while the channel layer 62 is constructed from an intrinsic semiconductor such as amorphous silicon. The gate 51 is separated from the drain 53 and source 54 by a suitable dielectric layer 52 (e.g., silicon nitride). The pass transistor 72 is covered with an insulating dielectric layer 55 (e.g., silicon nitride). This insulating dielectric 55 is in turn covered with an opaque material 56 such as titanium/tungsten, and a silicon oxynitride layer 57. Access to drain 53 is maintained with a via, into which an n-type layer 58 (fabricated from e.g., n+ amorphous silicon) is deposited. Atop this layer 58 are sequentially deposited a layer 59 consisting of intrinsic amorphous silicon and a p-layer 63. A transparent conductive layer 60 such as indium tin oxide is deposited over this p-type layer 63, and a conducting metal grid 61 is fabricated in electrical contact with the transparent conductive layer 60. In situations where electrical cross talk is not significant, layers 56 and 57 can be omitted and grid 61 can be arranged to act as a light shield.

The response of sensor array 70 to incident radiation is similar to the previously described sensor array 20 of FIGS. 7 and 8. The metal grid 61 is reverse biased so that layers 63, 59, and 58 together form a p-i-n detector. Illumination of the sensor array 70 with incident radiation causes the formation of electrons and holes in the intrinsic layer 59. Electrons drift toward the layer 58, and remain there until the pass transistor 72 is activated to sample the stored charge for measurement.

Figure 12:
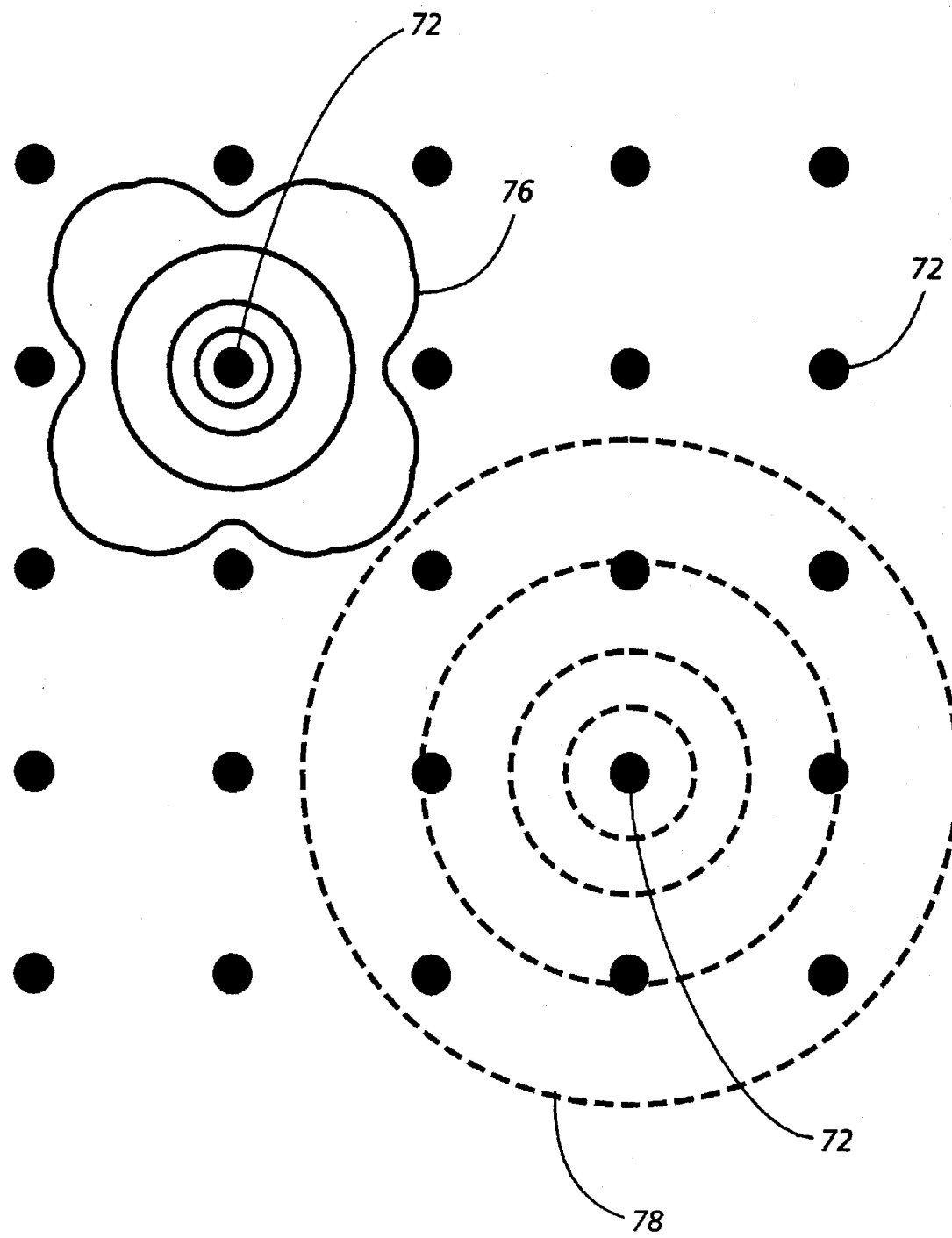
FIG. 12 schematically represents isocurrent charge collection contours of photosensitivity for a two dimensional detector element array such as illustrated in FIGS. 10 and 11.

The electrical response of a layer 58 in sensor array 70 to incident radiation is qualitatively indicated in FIG. 12. When the termination impedance is small compared with sheet resistance of the layer 58, the amount of detector response overlap is relatively small, as indicated by solid isocurrent response lines 76 in FIG. 12. Conversely, if the termination impedance is increased to values comparable to or greater than the sheet resistance of the n-type layer 58, the effective collection region centered on the pass transistors 72 increases in size as indicated by dashed isocurrent response lines 78 in FIG. 12.

Figure 13:
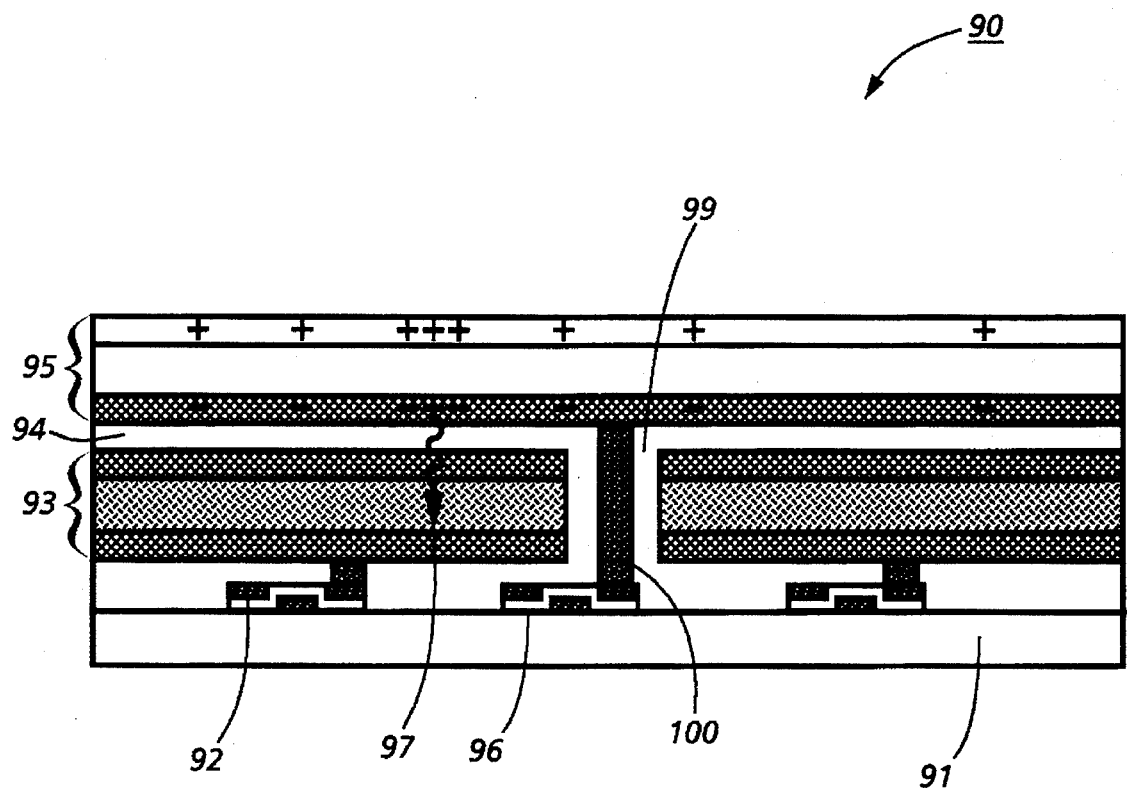
FIG. 13 depicts a cross sectional view of a one dimensional detector element array having physically overlapping patterned detectors.

FIG. 13 is a cross sectional view of yet another embodiment of the present invention similar to that discussed in connection with FIGS. 10 and 11. In this embodiment, a sensor array 90 includes a p-i-n sensor layer 95 that physically overlays a p-i-n sensor layer 93. A transparent insulating layer 94, such as silicon nitride, electrically isolates the two sensor layers 93 and 95, which can either be segmented or continuous. In the illustrated embodiment, sensor layer 95 is continuous, while sensor layer 93 is segmented. Field effect pass transistors 92 and 96 are fabricated on substrate 91 in substantially the same manner as discussed with respect to pass transistors 72 of FIGS. 10 and 11. The pass transistors 92 are electrically connected to the lower detectors, while the pass transistors 96 are connected electrically to layer sensor 95 using metallization path 100 through vias 99. By choosing parameters for the material thickness and composition the relative amounts of light absorbed by each of the sensor layers can be controlled. For example, if the sensor layer 95 is thick, about 25 nanometers, blue light will be substantially absorbed, permitting only longer wavelengths to be passed to sensor layer 93. Operation of this embodiment of the invention is otherwise similar to that discussed in conjunction with operation of the image array of FIGS. 10 and 11. Advantageously, this design for the overlapping receptive field detectors also has the inherent capability to allow color differentiation.

Figure 14:
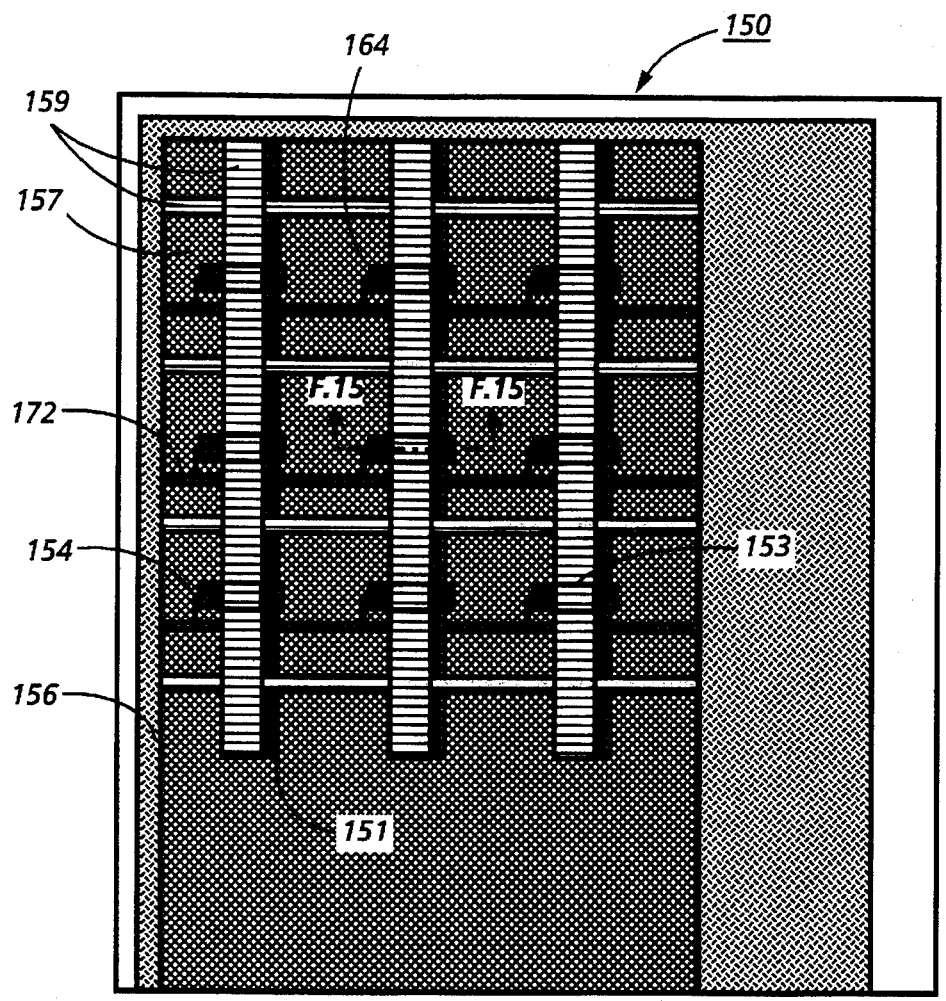
FIG. 14 presents a plan view of a alternative embodiment of a two dimensional overlapping detector element array.
Figure 15:
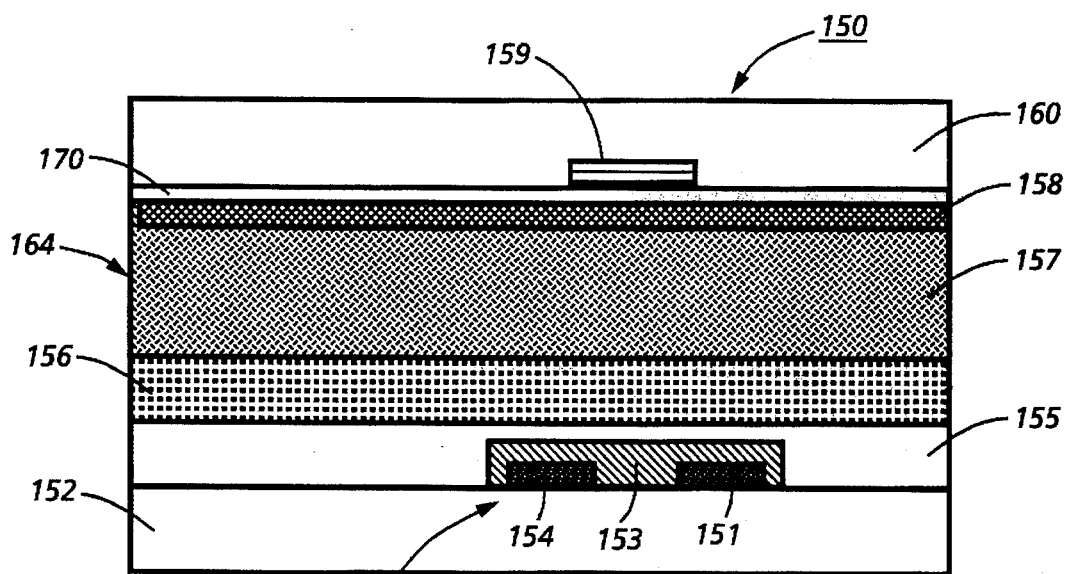
FIG. 15 depicts a cross sectional view taken substantially along line 15—15 of FIG. 14.

The overlapping receptive field detector array 150 shown in FIGS. 14 and 15 is also constructed and operated in a manner similar to previous embodiments. A thin-film field-effect pass transistor 162 is formed on substrate 152 to include a source 151, a drain 154, and an undoped amorphous silicon channel 153. The pass transistor 162 is covered by a thin insulator 155 (e.g., silicon nitride). Over this insulating layer 155 are an n-type layer 156, an intrinsic amorphous silicon layer 157, and a p-type layer 158 that together form a p-i-n photodiode 164. Over this p-i-n photodiode 164 are deposited a transparent contact 170 and an opaque bias distribution grid 170 formed from a metal layer such as Cr/Al. The structure of the distribution grid 170 also acts as a light shield to block unwanted photogeneration in the pass transistor 162. The entire sensor array 150 is encapsulated in a passivating layer 160 (e.g., silicon oxynitride).

In operation, incident radiation generates charges in the layer 157. In addition to the built-in field of the diode, a reverse bias applied to the p-i-n photodiode 164 causes vertical separation of photogenerated electron-hole pairs, with holes moving toward p-type layer 158 and electrons moving toward n-type layer 156. The flow of electrons in layer 156 acts as a gate for the pass transistor 162, altering amplitude of current flow between the source 151 and drain 154, and causing the current amplitude to be related to the number of electrons photogenerated in layer 157 and residing locally near the transistor 162. Charge for an image pixel associated with the pass transistor 162 is readout through data line 172 connected to drain 154. The photoinduced charge is sensed non-destructively, and the photogenerated charge is removed by forward biasing the photodiode 164 to dump the generated charge in preparation for the new exposure. Advantageously, this embodiment results in the smallest perturbation on the charge spreading in the p-i-n photodiode 164 and permits gain to be incorporated in the sensing process. Consequently, the potential sensitivity of this embodiment may exceed that of the previous embodiments. As with the previously discussed embodiments, sensing overlap between neighboring detector elements in the array 150 is a function of the resistivity of the n-type layer 156 and the termination impedance, and can be varied as desired to increase or decrease the amount of sensing overlap.

Figure 16:
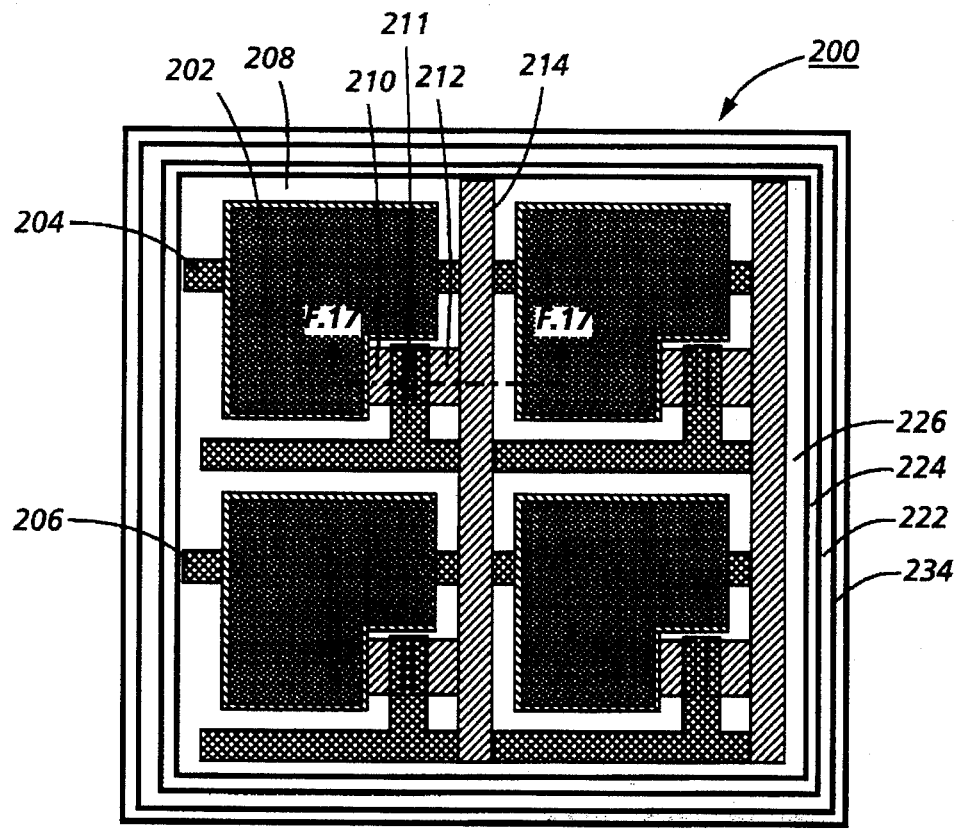
FIG. 16 presents a plan view of another alternative embodiment of a two dimensional overlapping detector element array.
Figure 17:
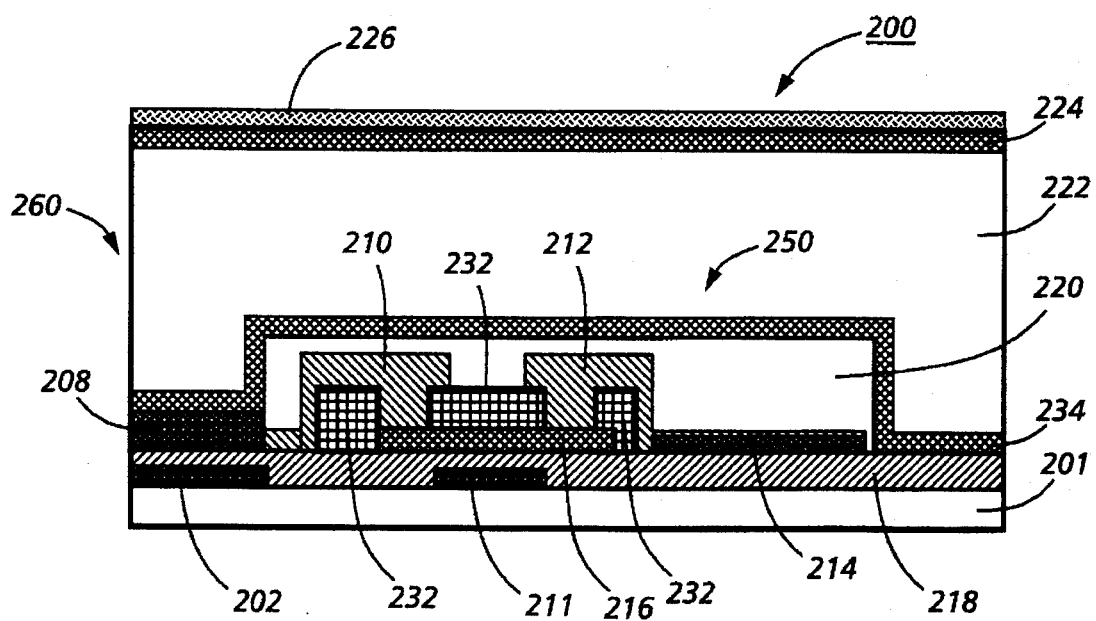
FIG. 17 depicts a cross sectional view taken substantially along line 17—17 of FIG. 16.

Yet another embodiment of the present invention is illustrated in FIGS. 16 and 17. A sensor array 200 includes a substrate 201 that supports a gate 211 (constructed e.g., from chromium) and a bottom electrode 202. These are covered with a dielectric layer 218 (e.g., silicon nitride). A pass transistor 250 is constructed on top of the dielectric layer 218, and includes a source 210, a drain 212, (source and drain are fabricated, for example, from heavily doped n-type amorphous silicon, or chromium), an intrinsic semiconductor channel 216 between the source and the drain, and a passivation dielectric 232. A data line 214 contacts the drain 212. An additional dielectric layer 220 surrounds the pass transistor 250.

Above the pass transistor 250 is positioned a p-i-n photodiode 260 that includes a p-type layer 234, an intrinsic layer 222, and an n-type layer 224, all covered with a top electrode layer 226 (e.g., transparent indium tin oxide). The sensor array 200 also supports a storage capacitor 208 adjacent to the pass transistor 250. As in the operation of previously described embodiments of the present invention, photogenerated charge is laterally distributed between neighboring detector elements. In this embodiment, charge is distributed in the p-type layer 234 and top electrode layer 226, and the amount of overlapped charge sharing is related to resistance and terminal impedance of the p-type layer 234. The storage capacitor 208 helps maintain potential of the pass transistor 250 at a low initial value (to act as a low impedance termination) even when several pass transistors are multiplexed onto a common data line.

It should be obvious to those skilled in the art that the field effect pass transistor can equally well be fabricated above the sensor layers of the previously described embodiments of the present invention. Similarly it is evident that the described field effect pass transistors can be replaced by crystalline or polycrystalline transistor after due allowance is made for thermal budget considerations. In addition, it will be appreciated that various layers of a sensor array (e.g., photodetector layers, bias distribution grids, etc.) can be segmented, patterned, or otherwise divided, as long as the charge distribution layer is substantially coextensive to ensure overlapping charge distribution.

While the present invention has been described in conjunction with specific embodiments thereof, it is evident that many alternatives, modifications, and variations will be apparent to those skilled in the art. Accordingly, the various embodiments described herein should be considered illustrative, and not limiting the scope of the present invention as defined in the following claims.

What is claimed is:

1. An image sensor array having overlapping responsive zones for detecting incident radiation, the image sensor array comprising a plurality of collection electrodes, each collection electrode having a termination impedance selected to define overlapping responsive zones, a charge distribution layer in contact with the collection electrodes for distributing charge generated from incident radiation to more than one collection electrode, and a radiation sensor for creating charge in response to incident radiation in electrical contact with the charge distribution layer, the radiation sensor having an n-type layer and a p-type layer.

2. The image sensor array of claim 1, wherein the radiation sensor further comprises an intrinsic amorphous silicon layer positioned between the n-type layer and the p-type layer to form a p-i-n photodiode.

3. The image sensor array of claim 1, further comprising an auxiliary radiation sensor separated from the radiation sensor by a dielectric layer, with collection electrodes in contact with the second radiation sensor.

4. An image sensor array having overlapping responsive zones for detecting incident radiation, the image sensor array comprising a plurality of collection electrodes, each collection electrode having a termination impedance selected to define overlapping responsive zones, a charge distribution layer in contact with the collection electrodes for distributing charge generated from incident radiation to more than one collection electrode in response to said selected termination impedance, a radiation sensor for creating charge in response to incident radiation in electrical contact with the charge distribution layer, the radiation sensor having an n-type layer and a p-type layer, and a plurality of pass transistors connected to transfer charge from each of the plurality of collection electrodes.

5. The image sensor array of claim 4, wherein each pass transistor has a drain connected to one of the collection electrodes, a source separated from the drain, and a pass transistor gate electrode controllable to promote transfer of charge from the drain to the source.

6. The image sensor array of claim 4, wherein each of the collection electrodes is a pass transistor in electrical contact with the radiation sensor, the pass transistor being responsive to charge from the radiation sensor to control current passing between a drain and a source.

7. An image sensor array for reducing aliasing artifacts, the image sensor array comprising a plurality of detection zones for producing generated charge, with each detection zone having a charge collection element for holding charge, with local detection response in each detection zone smoothly decreasing with distance from each charge collection element, and wherein neighboring detection zones overlap.

* * * * *